United States Patent
Zhai et al.

(10) Patent No.: US 9,589,990 B2
(45) Date of Patent: Mar. 7, 2017

(54) THIN-FILM TRANSISTOR ARRAY SUBSTRATE, MANUFACTURING METHOD THEREFOR AND DISPLAY DEVICE THEREOF

(71) Applicants: Shanghai Tianma Micro-Electronics Co., Ltd., Shanghai (CN); Tianma Micro-Electronics Co., Ltd., Shenzhen (CN)

(72) Inventors: Yingteng Zhai, Shanghai (CN); Yong Wu, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/749,585

(22) Filed: Jun. 24, 2015

(65) Prior Publication Data

US 2015/0380437 A1    Dec. 31, 2015

(30) Foreign Application Priority Data

Jun. 30, 2014   (CN) .......................... 2014 1 0309416

(51) Int. Cl.
```
H01L 27/12      (2006.01)
H01L 29/786     (2006.01)
H01L 21/4757    (2006.01)
H01L 29/423     (2006.01)
```
(52) U.S. Cl.
CPC ........ *H01L 27/124* (2013.01); *H01L 27/1225* (2013.01)

(58) Field of Classification Search
CPC .......................... H01L 27/124; H01L 27/1225
See application file for complete search history.

(56) References Cited

U.S. PATENT DOCUMENTS

| | | | | |
|---|---|---|---|---|
| 2007/0267648 A1* | 11/2007 | Hwang | ............... | H01L 27/3253 257/99 |
| 2011/0012104 A1* | 1/2011 | Kang | ..................... | H01L 27/12 257/43 |
| 2013/0106679 A1* | 5/2013 | Chen | ................. | G02F 1/136286 345/92 |

FOREIGN PATENT DOCUMENTS

| | | |
|---|---|---|
| CN | 101075612 A | 11/2007 |
| KR | 10-2012-0039947 A | 4/2012 |

* cited by examiner

*Primary Examiner* — Whitney T Moore
(74) *Attorney, Agent, or Firm* — Alston & Bird LLP

(57) ABSTRACT

A thin-film transistor array substrate is disclosed. The array substrate includes a support substrate, a plurality of scan lines on the support substrate, and a plurality of data lines on the support substrate, where the plurality of scan lines are insulated and intersect with the plurality of data lines. The array substrate also includes a plurality of pixel units located near intersections of the scan lines and the data lines, a first metal layer on the support substrate, and an insulating layer on the first metal layer, where the insulating layer includes a plurality of via holes, each exposing a portion of the first metal layer. The array substrate also includes a semiconductor layer on the insulating layer and electrically connected to the first metal layer, and a second metal layer on the semiconductor layer and electrically connected to the semiconductor layer.

12 Claims, 4 Drawing Sheets

THIN-FILM TRANSISTOR ARRAY SUBSTRATE, MANUFACTURING METHOD THEREFOR AND DISPLAY DEVICE THEREOF

CROSS-REFERENCES TO RELATED APPLICATIONS

This application claims the benefit of priority to Chinese Patent Application No. 201410309416.1 filed on Jun. 30, 2014 and entitled "THIN-FILM TRANSISTOR ARRAY SUBSTRATE, MANUFACTURING METHOD THEREFOR AND DISPLAY DEVICE THEREOF", the content of which is incorporated herein by reference in its entirety.

TECHNICAL FIELD

The present disclosure relates to display technologies, in particular to a thin-film transistor (TFT) array substrate, a manufacturing method therefor and a display device including the TFT array substrate.

BACKGROUND OF THE INVENTION

Organic Light-Emitting Diodes (OLEDs) have outstanding features such as self-luminosity, a high contrast, a small thickness, a wide viewing angle, fast responsivity, applicability to a flexible display panel, a wide range of operation temperatures, and a simple construction and manufacturing process, need not for a backlight, and hence have been regarded as emerging technology for the next generation of flat panel displays.

In the related art, power lines of an OLED display are typically disposed in a pixel region, driving elements and driven elements are connected between the power lines, and an image is displayed as desired by controlling conductance of the driving elements. If a thin-film transistor is employed as the driving element, a source electrode of the thin-film transistor is connected to a power supply, and a voltage corresponding to displayed data is applied to a gate electrode of the thin-film transistor, so that electric current corresponding to a voltage across the gate electrode and the source electrode of the thin-film transistor is supplied to the driven element. Wiring interconnections between different thin-film transistors are required for circuitry in the pixel region of the OLED display, and are realized by means of via holes in an insulating layer.

At present, the via hole is formed by directly etching a gate insulation layer to expose a gate electrode metal, then a source-drain electrode metal covers the via hole and connects the gate electrode metal. In the design of the via hole, the periphery of the source-drain electrode metal need extend beyond an edge of the via hole by a sufficient distance, to ensure that the source-drain electrode metal completely covers the via hole, thereby preventing the exposure of the gate electrode metal. Otherwise, in etching the source-drain electrode metal, there is a risk that the gate electrode metal is etched and hence the resistance of a connection based on the via hole is too large and the via hole is eroded. If an area of the source-drain electrode metal is large enough, the risk of etching the gate electrode metal around the via hole by mistake is reduced, whereas the area of the source-drain electrode metal around the via hole is too large. Considering exposure precision, wirings for the source-drain metal around the via hole need to be far away from the via hole, causing difficulties in designing an OLED pixel circuit, which is disadvantageous for improving Pixels Per Inch (PPI) and stability of the OLED display.

DETAILED DESCRIPTION OF THE PREFERRED EMBODIMENTS

Figure 1:
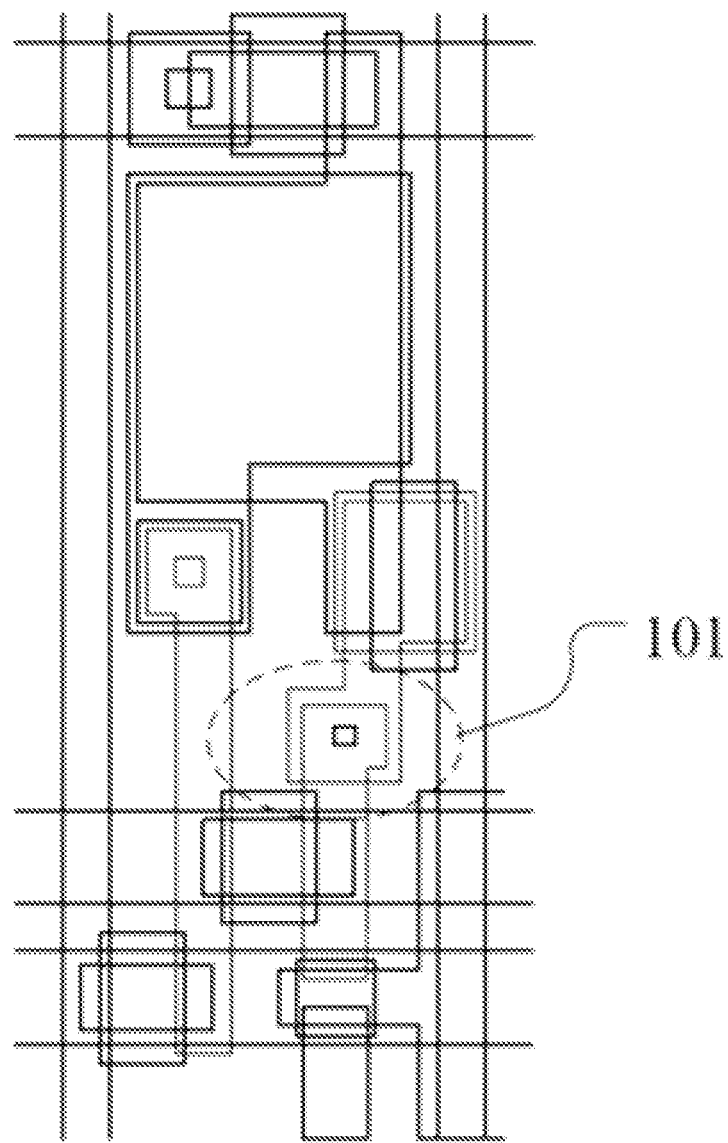
FIG. 1 is a schematic diagram showing a structure of a pixel unit on an array substrate of an OLED display in the related art.
Figure 2:
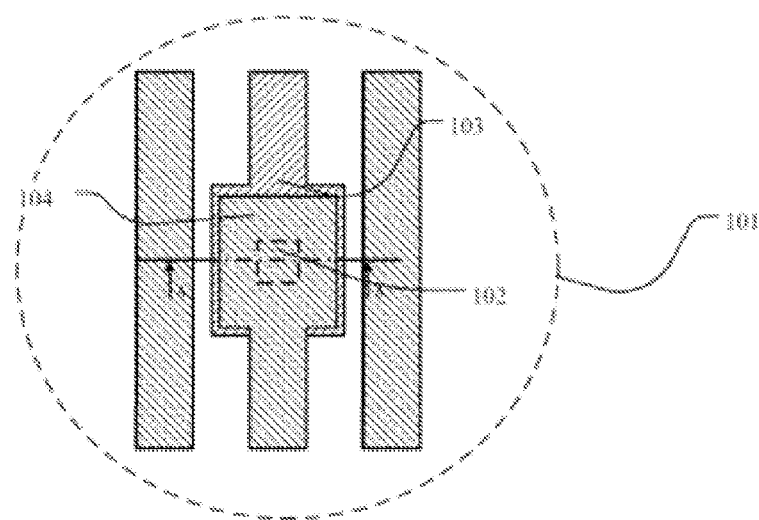
FIG. 2 is a partial enlarged view showing a wiring interconnection region in FIG. 1.
Figure 3:
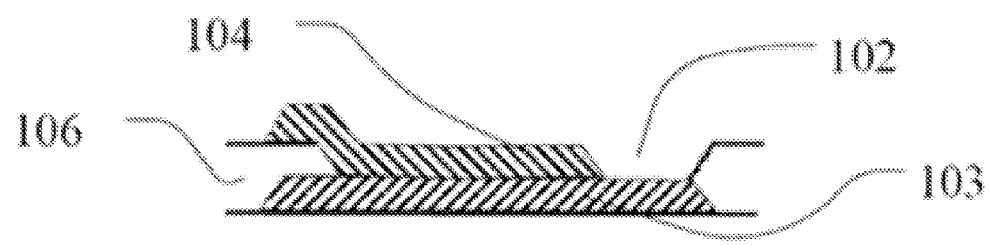
FIG. 3 is a schematic sectional view showing a structure of the wiring interconnection region in FIG. 1.

Reference is made to FIG. 1 and FIG. 2 below. FIG. 1 is a schematic diagram showing the structure of a pixel unit on an array substrate of an OLED display in the related art. As can be seen from FIG. 1, a plurality of thin-film transistors and a light emitting element are disposed in each pixel unit on the array substrate of the OLED display in the related art, and the thin-film transistors are configured to control current supplied to the light emitting element. Circuitry within the pixel region requires for wiring interconnections between different thin-film transistors, that is, in a wiring interconnection region 101, the wiring interconnection for a gate metal and a source-drain metal is realized by means of a via hole in the insulating layer. Referring to FIG. 2 and FIG. 3, FIG. 2 is a partial enlarged view showing the wiring interconnection region in FIG. 1, and FIG. 3 is a schematic sectional view showing the structure of the wiring interconnection region. As shown, the wiring interconnection region 101 on the array substrate of the OLED display in the related art includes a substrate (not shown), a gate electrode layer 103 disposed on the substrate, an insulating layer 106 disposed on the gate electrode layer 103, a via hole 102 formed in the insulating layer 106, and a source-drain electrode metal 104 disposed in the via hole 102.

In the related art, the via hole is formed by directly etching a gate insulation layer to expose a gate electrode metal, then a source-drain electrode metal covers the via hole and connects the gate electrode metal. In the design of the via hole, the periphery of the source-drain electrode metal need extend beyond an edge of the via hole by a sufficient distance, to ensure that the source-drain electrode metal completely covers the via hole, thereby preventing the exposure of the gate electrode metal. Otherwise, in etching the source-drain electrode metal, there is a risk that the gate electrode metal is etched and hence the resistance of a connection based on the via hole is too large and the via hole is eroded. If an area of the source-drain electrode metal is large enough, the risk of etching the gate electrode metal around the via hole by mistake is reduced, whereas the area of the source-drain electrode metal around the via hole is too large. Considering exposure precision, wirings for the source-drain metal around the via hole need to be far away from the via hole, causing difficulties in designing an OLED pixel circuit, which is disadvantageous for improving Pixels Per Inch (PPI) and stability of the OLED display.

Now, the present disclosure will be more adequately described below with reference to the drawings showing exemplary embodiments of the present disclosure. The present disclosure may be implemented by various ways and should not be limited to the embodiments provided here. In contrast, these embodiments are provided to make the present disclosure thorough and complete, and convey a protection scope of the present disclosure clearly to a person skilled in the art. Like reference numerals refer to like elements throughout.

It should be understood that if one element is described as being disposed on another element, the one element may be directly disposed on the another element, or an intermediate element may be disposed between the one element and the another element. In contrast, if one element is described as being directly disposed on another element, there is no intermediate element between the one element and the another element. The term "and/or" as used here includes any combination of one or more or even all listed relevant items.

It should be understood that though the terms "first", "second" and "third" here can be used to describe different elements, components, regions, layers and/or portions, these elements, components, regions, layers and/or portions should not be limited by these terms such as "first", "second" and "third". These terms "first", "second" and "third" are merely used to distinguish one element, component, region, layer and/or portion from another element component, region, layer and/or portion. Therefore, a first element, component, region, layer and/or portion can be named as a second element, component, region, layer and/or portion without departing from the teaching of the present disclosure.

Terms used here are intended to describe the specific embodiments, but not intended to limit the present disclosure. As used here, the plural is contemplated unless limitation to the singular is explicitly stated. It should be also understood that the terms "include" and/or "comprise" used in the present disclosure means the presence of the described feature, region, entirety, step, operation, element and/or component, but do not exclude an additional one or more other features, regions, entireties, steps, operations, elements and/or components.

Relative terms such as "below" or "bottom" and "above" or "top" are used to describe a relationship between one element and other elements as shown in the drawings. It should be understood that the relative terms are intended to include different directions of the device in addition to the directions of the device shown in the drawings. For example, if the device in a certain figure is reversed, one element described as "below" another element should be described as "above" the another element. Therefore, an exemplary term "below" may be interpreted as a "lower" level or an "upper" level depending on the specific directions shown in the drawings. Similarly, if the device in a certain figure is reversed, one element described as "below" or "at the bottom of" another element should be described as "above" the another element. Therefore, an exemplary term such as "below" or "at the bottom of" may include both of a "lower" level and an "upper" level.

The present embodiment provides a thin-film transistor array substrate which includes: a substrate; a plurality of scan lines and a plurality of data lines both disposed on the substrate, where the plurality of data lines are insulated and intersect with the plurality of scan lines, and a plurality of pixel units are defined by the scan lines and the data lines; a first metal layer disposed on the substrate; an insulating layer disposed on the first metal layer, where the insulating layer includes a plurality of via holes which expose a portion of the first metal layer; a semiconductor layer which is disposed on the insulating layer and electrically connected to the first metal layer; and a second metal layer which is disposed on the semiconductor layer and electrically connected to the semiconductor layer.

The present embodiment further provides a display device which includes the above thin-film transistor array substrate.

The present embodiment further provides a manufacturing method for the thin-film transistor array substrate, and the method includes: providing a substrate; forming a first metal layer on the substrate, and patterning the first metal layer to obtain a gate electrode; forming an insulating layer on the first metal layer, and patterning the insulating layer to form a plurality of via holes in the insulating layer, where a portion of the first metal layer is exposed by the via holes; forming a semiconductor layer on the insulating layer, with the semiconductor layer being electrically connected to the first metal layer; and forming a second metal layer on the semiconductor layer, with the second metal layer being electrically connected to the semiconductor layer.

In this way, in the present embodiment, the semiconductor layer is used as an etch stop layer. The semiconductor layer is etched at a very slow rate during dry etching the source-drain electrode metal, thereby preventing the gate electrode metal below the semiconductor layer from being etched. As such, the source-drain electrode metal with a large area is not needed any more for protecting the gate electrode metal below the via holes. Since the semiconductor layer and the source-drain electrode metal are patterned by different photomasks, the exposure precision is not problematic. Even considering an alignment deviation under the existing technological conditions, wirings for the source-drain metal around the via hole may be nearer to the via hole compared with the existing technical solutions, so as to improve the flexibility in design.

In order to make the above aspects, features and advantages more clear and apparent, the present disclosure will be further illustrated in combination with the drawings and the embodiments.

Figure 4:
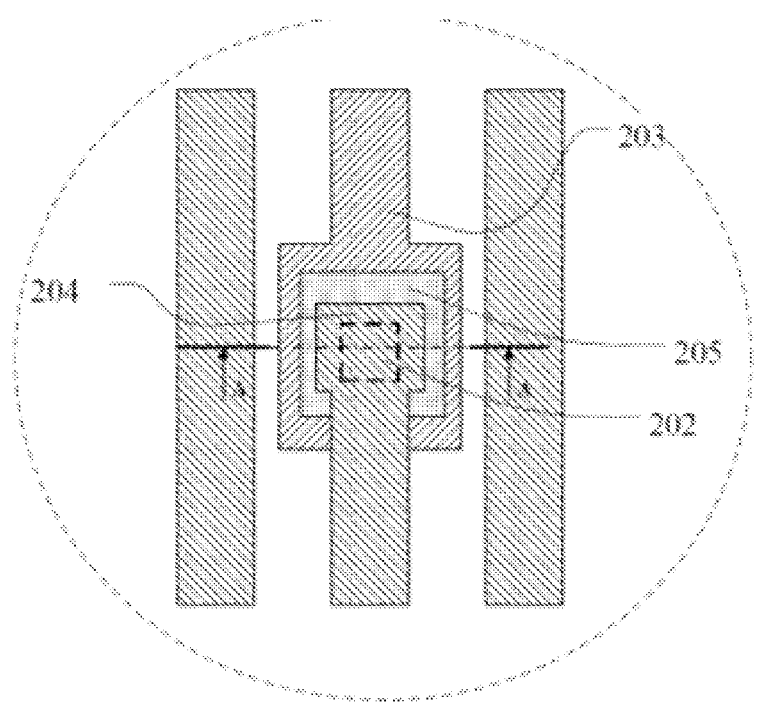
FIG. 4 is a schematic view showing a structure of a wiring interconnection region of a thin-film transistor array substrate according to an embodiment of the present disclosure.
Figure 5:
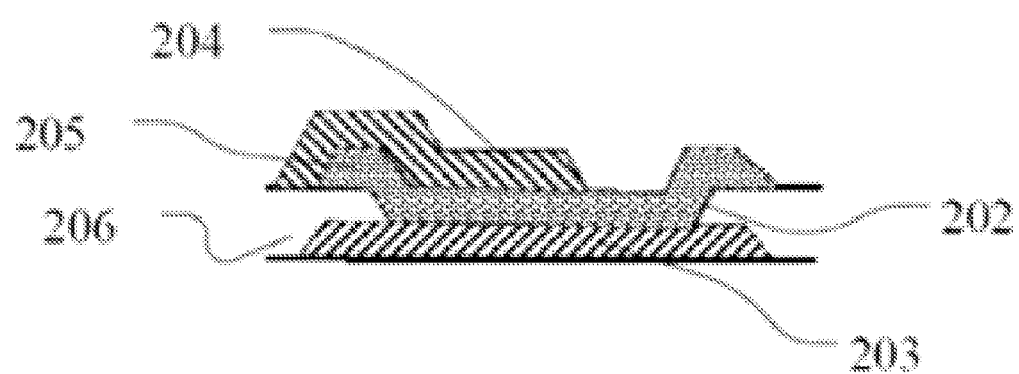
FIG. 5 is a schematic sectional view showing the structure of the wiring interconnection region of the thin-film transistor array substrate according to an embodiment of the present disclosure.

Reference is now made to FIG. 4 and FIG. 5. FIG. 4 is a schematic view showing the structure of a wiring interconnection region of a thin-film transistor array substrate according to an embodiment of the present disclosure. FIG. 5 is a schematic sectional view showing the structure of the wiring interconnection region of the thin-film transistor array substrate according to an embodiment of the present disclosure. As shown, the thin-film transistor array substrate according to the first embodiment of the present disclosure includes: a substrate (not shown) which may be a rigid substrate or a flexible substrate, but the present embodiment is not limited thereto; a plurality of scan lines and a plurality of data lines (not shown) both disposed on the substrate, where the plurality of data lines are insulated and intersect with the plurality of scan lines, and a plurality of pixel units (not shown) are defined by the scan lines and the data lines; a first metal layer 203 disposed on the substrate; an insulating layer 206 disposed on the first metal layer 203, where the insulating layer 206 includes a plurality of via holes 202 which expose a portion of the first metal layer 203; a semiconductor layer 205 which is disposed in the via holes 202 in the insulating layer 206 and electrically connected to first metal layer 203, where the semiconductor layer 205 may be an amorphous semiconductor layer, a polycrystalline silicon semiconductor layer or an oxide semiconductor layer and so on, but the present embodiment is not limited thereto and the semiconductor layer 205 is described as the oxide semiconductor layer for example in the present embodiment; and a second metal layer 204 which is disposed on the semiconductor layer 205 and electrically connected to the semiconductor layer 205.

The thin-film transistor array substrate further includes a plurality of thin-film transistors disposed in the pixel units, and each of the thin-film transistors includes a gate electrode, a gate insulation layer, a semiconductor active layer, a source electrode and a drain electrode. Optionally, the first metal layer 203 is disposed on the same layer as the gate electrodes of the thin-film transistors, the insulating layer 206 is disposed on the same layer as the gate insulation layers of the thin-film transistors, the semiconductor layer 205 is disposed on the same layer as the semiconductor active layers of the thin-film transistors, and the second metal layer 204 is disposed at the same layer as the source electrodes and/or the drain electrodes of the thin-film transistors. In this way, no additional step is needed for the manufacture process of the thin-film transistor array substrate when the semiconductor layer serves as an etch stop layer for the gate electrode metal.

Studies show that metal atoms can easily diffuse into the oxide semiconductor layer to convert the oxide semiconductor layer into a conductor layer, which has resistance approximate to that of Indium tin oxide (ITO). Considering that an oxide film has a thickness in a range from 50 Å to 1000 Å merely, an intermediate oxide layer added between the gate electrode metal and the source-drain electrode metal will not cause high via hole resistance.

The technical solution according to the present embodiment is particularly suitable to the design of OLED pixels. In the present embodiment, the oxide semiconductor layer is used as an etch stop layer. The oxide is etched at a very slow rate during dry etching the source-drain electrode metal, thereby preventing the gate electrode metal below the oxide semiconductor layer from being etched. As such, the source-drain electrode metal with a large area is not needed any more for protecting the gate electrode metal below the via holes, and the area of the via hole may be reduced. Further, since the oxide semiconductor layer and the source-drain electrode metal are patterned by different photomasks, the exposure precision is not problematic. Even considering an alignment deviation under the existing technological conditions, wirings for the source-drain metal around the via hole may be nearer to the via hole compared with the existing technical solutions, so as to improve the flexibility in design.

In order to improve conduction characteristics of the oxide semiconductor layer, an annealing treat is performed on the oxide semiconductor layer and the source-drain metal as manufactured, so that metal particles in the source-drain electrode may diffuse into the transparent oxide semiconductor layer, which is then converted into a conductor layer because a large number of oxygen vacancies are generated in the oxide semiconductor layer. Considering that a thickness of the oxide film is in a range from 50 Å to 1000 Å merely, the resistance will not be increased significantly.

The present embodiment further provides a display device which includes the above thin-film transistor array substrate. The display device may be a liquid crystal display device or an organic light emitting display device.

Figure 6:
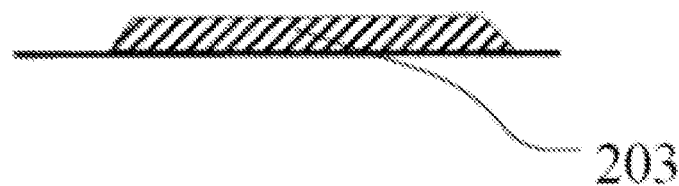
FIG. 6 to FIG. 9 are schematic views showing a structure of a wiring interconnection region of a thin-film transistor array substrate during a manufacture process thereof according to another embodiment of the present disclosure.
Figure 7:
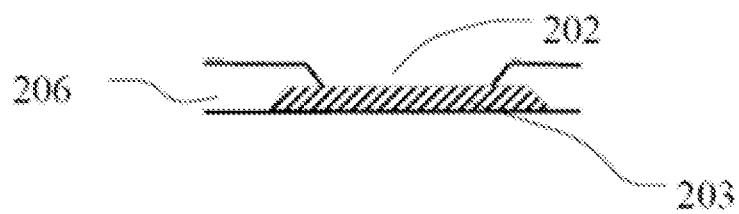
Figure 8:
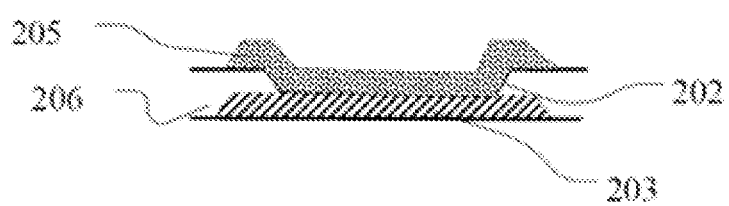
Figure 9:
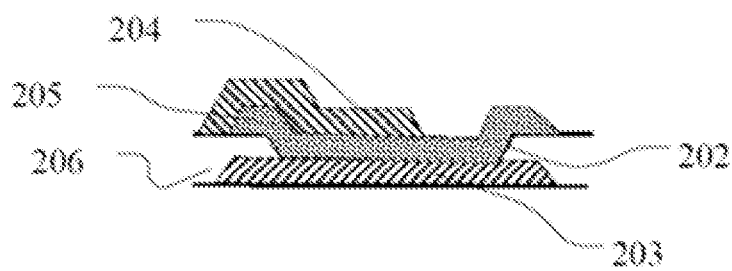

Referring to FIG. 6 to FIG. 9 which are schematic views showing the structure of a wiring interconnection region of a thin-film transistor array substrate during a manufacture process thereof according to the second embodiment of the present disclosure. A manufacturing method for the wiring interconnection region of the thin-film transistor array substrate according to the present disclosure includes: providing a substrate (not shown); forming a first metal layer on the substrate and patterning the first metal layer to obtain a gate electrode 203, as shown in FIG. 6; forming an insulating layer 206 on the gate electrode 203, and patterning the insulating layer 206 to form a plurality of via holes 202 in the insulating layer, where a portion of the gate electrode 203 is exposed by the via holes 202, as shown in FIG. 7; forming a semiconductor layer 205 in the via holes 202 in the insulating layer 206, where the semiconductor layer 205 is electrically connected to the gate electrode 203, as shown in FIG. 8; and forming a second metal layer 204 on the semiconductor layer 205, where the second metal layer 204 is electrically connected to the semiconductor layer 205, as shown in FIG. 9.

The forming the first metal layer on the substrate and patterning the first metal layer further includes forming a gate electrode of the thin-film transistor. The forming a semiconductor layer on the insulating layer further includes forming a semiconductor active layer of the thin-film transistor. The forming a second metal layer on the semiconductor layer and patterning the second metal layer further includes forming a source electrode and/or a drain electrode of the thin-film transistor.

The present disclosure has been further illustrated in detail in combination with the preferred embodiment and the above contents. The specific implementation of the present disclosure should not be limited to the illustration. Various modifications, equivalent substitutions and improvements made to the embodiments in light of spirit and principle of the present disclosure without departing from the disclosures of the invention all fall into the protection scope of the invention.

What is claimed is:

1. A thin-film transistor array substrate comprising:
    a substrate;
    a plurality of scan lines on the substrate;
    a plurality of data lines on the substrate, wherein the plurality of scan lines are insulated and intersect with the plurality of data lines, and a plurality of pixel units are located near the intersections of the scan lines and the data lines;
    a gate electrode metal layer on the substrate;
    an insulating layer on the gate electrode metal layer, wherein the insulating layer comprises a via hole exposing a portion of the gate electrode metal layer;
    a semiconductor layer on the insulating layer wherein a portion of the semiconductor layer fills the via hole and contacts the gate electrode metal layer; and
    a source/drain electrode metal layer on the semiconductor layer, wherein the source/drain electrode metal layer fills the via hole partially by a patterning process using the semiconductor layer as an etch stop layer, wherein the gate electrode metal layer, the semiconductor layer and the source/drain electrode metal layer overlap at least partially.

2. The thin-film transistor array substrate of claim 1, further comprising a plurality of thin-film transistors in the pixel units, wherein each of the thin-film transistors comprises:
    a gate electrode;
    a gate insulation layer;
    a semiconductor active layer;

a source electrode; and
a drain electrode.

3. The thin-film transistor array substrate of claim 2, wherein the first metal layer is formed in the same layer as the gate electrode of the thin-film transistor.

4. The thin-film transistor array substrate of claim 3, wherein the insulating layer is formed in the same layer as the gate insulation layer of the thin-film transistor.

5. The thin-film transistor array substrate of claim 4, wherein the semiconductor layer is formed in the same layer as the semiconductor active layer of the thin-film transistor.

6. The thin-film transistor array substrate of claim 5, wherein the second metal layer is formed in the same layer as at least one of the source electrode and the drain electrode of the thin-film transistor.

7. The thin-film transistor array substrate of claim 1, wherein the material of the semiconductor layer is an oxide semiconductor and a thickness of the semiconductor layer is 50-1000 Å.

8. A display device comprising a thin-film transistor array substrate, the thin-film transistor array substrate comprising
a substrate;
a plurality of scan lines on the substrate;
a plurality of data lines on the substrate, wherein the plurality of scan lines are insulated and intersect with the plurality of data lines, and a plurality of pixel units are located near the intersections of the scan lines and the data lines;
a gate electrode metal layer on the substrate;
an insulating layer on the gate electrode metal layer, wherein the insulating layer comprises a via hole exposing a portion of the gate electrode metal layer;
a semiconductor layer on the insulating layer wherein a portion of the semiconductor layer fills the via hole and contacts the gate electrode metal layer; and
a source/drain electrode metal layer on the semiconductor layer, wherein the source/drain electrode metal layer fills the via hole partially by a patterning process using the semiconductor layer as an etch stop layer, wherein the gate metal layer, the semiconductor layer and the source/drain electrode metal layer overlap at least partially.

9. A method of manufacturing a thin-film transistor array substrate, the method comprising:
providing a substrate;
forming a first metal layer on the substrate;
patterning the first metal layer to form a gate electrode;
forming an insulating layer on the first metal layer;
patterning the insulating layer to form a via hole in the insulating layer, wherein a portion of the first metal layer is exposed by the via hole;
forming a semiconductor layer on the insulating layer, wherein a portion of the semiconductor layer fills the via hole and contacts the first metal layer;
forming a second metal layer on the semiconductor layer, wherein the second metal layer fills the via hole partially; and
patterning the second metal layer to form source and drain electrodes, wherein the gate metal layer, the semiconductor layer, and the source and drain electrode metal layer overlap at least partially, and the semiconductor layer is used for preventing the gate electrode from being etched.

10. The method of manufacturing the thin-film transistor array substrate of claim 9, wherein forming the first metal layer on the substrate and patterning the first metal layer comprise forming a gate electrode of the thin-film transistor.

11. The method of manufacturing the thin-film transistor array substrate of claim 10, wherein forming the semiconductor layer on the insulating layer comprises forming a semiconductor active layer of the thin-film transistor.

12. The method of manufacturing the thin-film transistor array substrate of claim 11, wherein forming the second metal layer on the semiconductor layer and patterning the second metal layer comprise forming at least one of a source electrode and a drain electrode of the thin-film transistor.

* * * * *